United States Patent [19]
Nakai

[11] Patent Number: 5,563,708
[45] Date of Patent: Oct. 8, 1996

[54] SEMICONDUCTOR DEVICE MANUFACTURING METHOD WHEREIN THE SUBSTRATE IS INTERFERICALLY ALIGNED BY MEASURING THE ROTATION OF THE ORIGINAL

[75] Inventor: Akiya Nakai, Tokyo, Japan

[73] Assignee: Canon Kabushiki Kaisha, Tokyo, Japan

[21] Appl. No.: 252,580

[22] Filed: Jun. 1, 1994

[30] Foreign Application Priority Data

Jun. 1, 1993 [JP] Japan .................................. 5-130543

[51] Int. Cl.$^6$ .................................................. G01B 9/02
[52] U.S. Cl. .......................... 356/363; 356/358; 356/400
[58] Field of Search .................................. 356/356, 358, 356/363, 401, 400; 250/548

[56] References Cited

U.S. PATENT DOCUMENTS

| | | | |
|---|---|---|---|
| 4,629,313 | 12/1986 | Tanimoto | 356/401 |
| 4,792,693 | 12/1988 | Yamaguchi et al. | 250/548 |
| 4,811,059 | 3/1989 | Hamasaki et al. | |
| 4,881,100 | 11/1989 | Nakai et al. | 250/548 |
| 4,918,320 | 4/1990 | Hamasaki et al. | |
| 5,114,234 | 5/1992 | Otsuka et al. | 356/358 |
| 5,151,749 | 9/1992 | Tanimoto et al. | 356/363 |
| 5,153,678 | 10/1992 | Ota | 250/548 |
| 5,243,195 | 9/1993 | Nishi | 356/401 |
| 5,363,196 | 11/1994 | Cameron | 356/363 |
| 5,369,488 | 11/1994 | Murokuma | 356/358 |

FOREIGN PATENT DOCUMENTS 4-55523  9/1992  Japan .
6-181165  8/1994  Japan .

*Primary Examiner*—Samuel A. Turner
*Attorney, Agent, or Firm*—Fitzpatrick, Cella, Harper & Scinto

[57] ABSTRACT

In a step-and-repeat type semiconductor device manufacturing exposure apparatus, a pattern of a reticle can be transferred to a wafer with no chip rotation or no array error. For this sake, the direction of rotation of an X axis or a Y axis of the reticle about a Z axis is detected, and an X-Y-θ stage is rotationally moved about the Z axis in accordance with the detected value and by using a measurement output of a laser interferometer. Also, after rotational movement of the X-Y-θ stage about the Z axis, the X-Y-θ stage is moved while using a measurement output of the laser interferometer, to print the pattern of the reticle onto different zones of the wafer sequentially.

9 Claims, 10 Drawing Sheets

5,563,708

SEMICONDUCTOR DEVICE MANUFACTURING METHOD WHEREIN THE SUBSTRATE IS INTERFERICALLY ALIGNED BY MEASURING THE ROTATION OF THE ORIGINAL

FIELD OF THE INVENTION AND RELATED ART

This invention relates to a semiconductor device manufacturing method for use with an exposure apparatus of the type called a stepper, for lithographically transferring a circuit pattern of an original (such as a reticle or mask, for example) onto a substrate (such as a semiconductor wafer, for example) in a step-and-repeat manner.

In semiconductor device manufacturing apparatuses (steppers) such as disclosed in U.S. Pat. No. 4,629,313 or corresponding Japanese Published Patent Application, Publication No. 55523/1992, for example, usually the movement of a wafer moving on an X-Y stage only in X and Y directions is controlled by using high precision position detecting means such as a laser interferometer, for example; whereas the movement thereof in a rotational direction (θ direction) about a Z axis is performed by using a relatively low precision driving means such as a pulse motor, for example. Further, a driving means for moving a reticle in the θ direction uses a pulse motor, for example, such that its precision is not high.

SUMMARY OF THE INVENTION

In exposure apparatuses of the type described above, the low driving precision with respect to movement of a reticle and a wafer in the θ direction may result in failure of exact registration of the orientation of the reticle with the movement direction of the X-Y stage. If it fails, then a problem such as illustrated in FIG. 3B arises. More specifically, as a pattern of the reticle is repeatedly printed on a virgin wafer having no pattern formed thereon, the shots (patterns) S do not align just along a straight line such as illustrated in FIG. 3A, but rather each shot S has a deviation (chip rotation) with respect to the direction (broken line) along which the shots are arrayed (FIG. 3B).

Further, when a pattern is to be printed superposedly on a wafer having circuit patterns already formed thereon, even if the reticle is rotated to obtain registration, the orientation of the reticle with the orientation of each shot on the wafer, the precision of registration is not good. There still remains the problem of alignment error due to the chip rotation.

If the wafer is rotated to obtain registration of the orientation of each shot of the wafer with the orientation of the reticle, then the wafer rotation having been measured beforehand for the wafer alignment changes. This necessitates a repeat of global alignment measurement and thus results in a decrease in the number of wafers to be processed per unit time (i.e., throughput).

Referring to FIGS. 4A and 4B, if patterns of different reticles are to be printed on each single wafer (those of shots S depicted by the same hatching are the shots on which a pattern of one and the same reticle is to be printed), the reticle orientation has to be adjusted with respect to the movement direction of the X-Y stage every time as one reticle is replaced by another. However, due to the low precision of the θ direction movement of the reticle and the wafer, it is very difficult to attain exact registration of the orientation of the reticle with the movement direction of the X-Y stage. Rather, it easily results in chip rotation such as illustrated in FIG. 4B.

The stepwise movement of the X-Y stage may be controlled in accordance with the orientation of the reticle such as disclosed in the aforementioned U.S. patent. However, if on that occasion different reticles have different orientations, a problem such as illustrated in FIG. 4C may arise: each shot S has no chip rotation but they are arrayed along different directions.

It is an object of the present invention to provide an improved semiconductor device manufacturing method by which a pattern of an original can be printed on a substrate such as a wafer, without chip rotation or array deviation.

In accordance with an aspect of the present invention, there is provided a semiconductor device manufacturing method for transferring a pattern of an original to zones of a substrate sequentially, said method comprising: an original holding step for holding the original by using an original stage; a substrate holding step for holding the substrate by using a substrate stage which is movable along X and Y axes and is rotatable about a Z axis, wherein the position of the substrate stage with respect to directions along the X and Y axes and to a rotational direction about the Z axis is measured through laser interferometer means; a detecting step for detecting a rotational direction, about the Z axis, of an X axis or a Y axis of the original held by the original stage; a rotationally moving step for rotationally moving the substrate stage about the Z axis on the basis of an output of the laser interferometer means and in accordance with a result of said detecting step; and an exposure step for moving, after said rotationally moving step, the substrate stage on the basis of an output of the laser interferometer means so that the pattern of the original is transferred to the zones of the substrate sequentially.

In accordance with this aspect of the present invention, the position of the substrate stage with respect to the θ direction can be controlled precisely by using high-precision laser interferometer means, and the axis direction of the substrate stage can be changed in accordance with the orientation of the original. Thus, the present invention in this aspect assures manufacture of semiconductor devices through a step-and-repeat type exposure apparatus, without causing chip rotation or array deviation.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
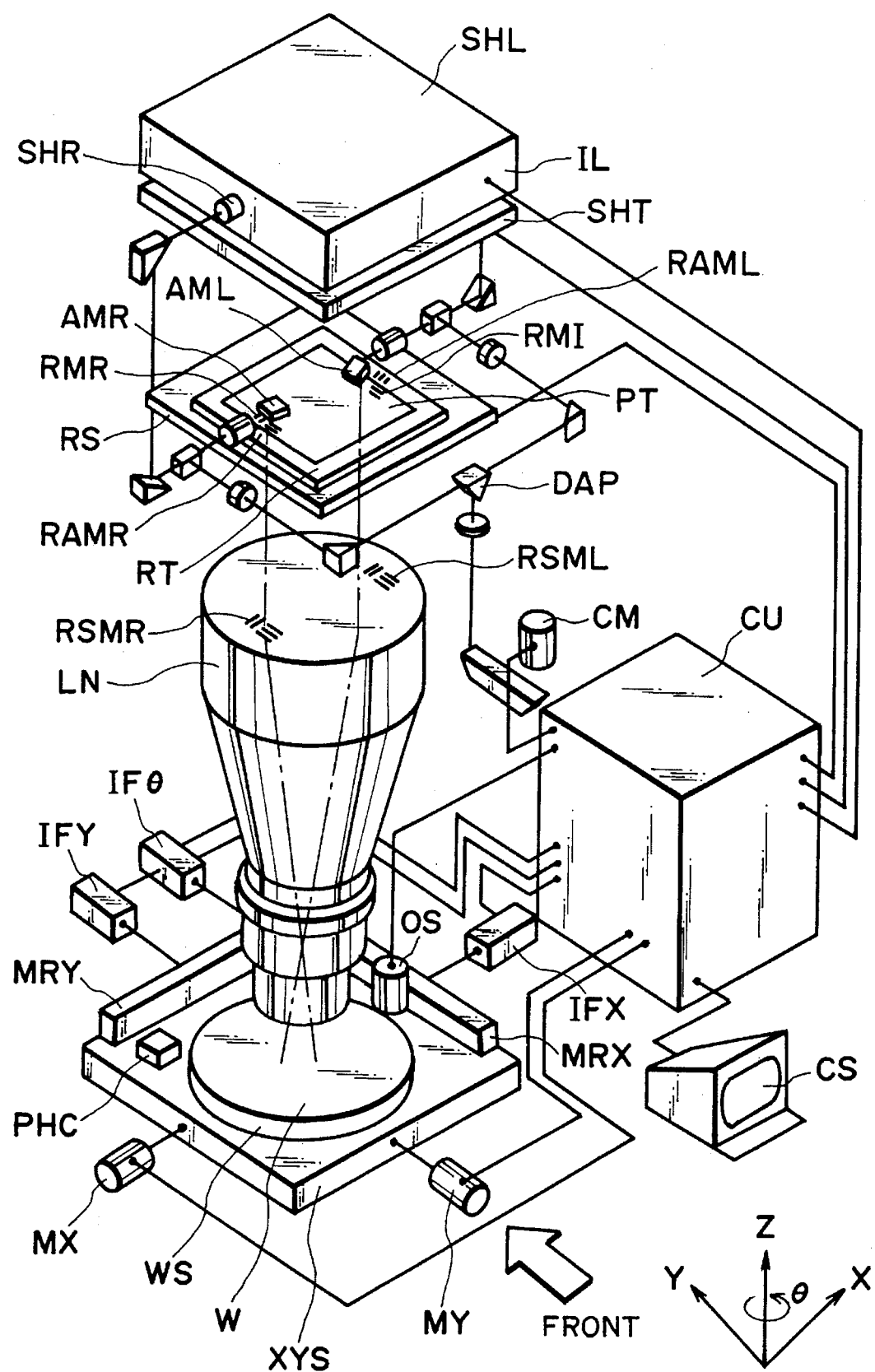
FIG. 1 is a perspective view schematically showing a step-and-repeat type semiconductor device manufacturing exposure apparatus according to an embodiment of the present invention.

FIG. 1 shows an embodiment of a semiconductor device manufacturing exposure apparatus of step-and-repeat type, called a stepper, in accordance with the present invention. Denoted in FIG. 1 at RT is a reticle on which a pattern PT for manufacture of semiconductor devices is formed. Denoted at LN is a projection lens for projecting in a reduced scale the pattern PT of the reticle RT on a wafer W which is placed on an X-Y-$\theta$ stage XYS. Denoted at CU is a control unit for controlling the stepper as a whole. Denoted at CS is a console which serves to input various necessary information such as alignment data, exposure data, etc. into the control unit or to store them into internal hard disc means, for example. The control unit CU comprises computers, memories, image processing means, X-Y-$\theta$ stage control means, etc.

The reticle RT can be held by the reticle stage RT through attraction, which stage can be moved along X, Y and $\theta$ directions in response to a signal from the control unit CU. The reticle RT is provided with reticle alignment marks RAMR and RAML to be used for aligning the reticle RT into a predetermined positional relationship with respect to the projection lens LN, as well as reticle marks RMR and RML which are to be transferred to a photochromic plate PHC. In this embodiment, the marks RMR and RML are formed at the same Y coordinate position on the reticle RT.

Reticle setting marks RSMR and RSML are formed on a member, fixed to the barrel of the projection lens LN, such that they are held in a predetermined positional relationship with the projection lens LN. For alignment of the reticle RT with respect to the projection lens LN, the paired marks RAMR and RSMR and the paired marks RAML and RSML are superposedly observed by means of an image pickup device CM through mark observation mirrors AMR and AML, and the reticle stage RS is moved so that the deviation between them as detectable from the output of the image pickup device is reduced into a predetermined range. The mark observation mirrors AMR and AML are movable along X and Y directions in response to a signal from the control unit CU.

Denoted at MX and MY are motors for moving the X-Y-$\theta$ stage XYS in the X and Y directions. An unshown $\theta$ motor (M$\theta$) is provided to rotate the X-Y-$\theta$ stage in a rotational $\theta$ direction. Denoted at MRX and MRY are mirrors which are fixed to the X-Y-$\theta$ stage. Denoted at IFX, IFY and IF$\theta$ are laser interferometers. By means of the laser interferometers IFX, IFY and IF$\theta$ and the mirrors MRX and MRY, the position of the X-Y-$\theta$ stage with respect to X-Y-$\theta$ coordinates can be continuously monitored and, additionally, by means of the motors MX, MY and M$\theta$, the stage can be moved to a position specified by the control unit CU. The control unit CU is operable to hold the X-Y-$\theta$ stage at the specified position on the basis of the outputs of the laser interferometers IFX, IFY and IF$\theta$.

Wafer stage WS serves to support a wafer, and it is movable in the Z direction relative to the X-Y-$\theta$ stage XYS. The wafer is held through attraction by this wafer stage WS. The photochromic plate PHC comprises a planar plate member on which a photosensitive material such as a spiropylan or spironaphtoxazine series photochromic material is applied. This plate member is fixed to the wafer stage WS, and it is positioned at the level about the imaging plane of the projection lens LN.

The transmissivity of the photosensitive material mentioned above with respect to the light of exposure wavelength from an exposure light source IL, is changeable temporally: a mark of the reticle can be transferred thereto, but the transferred pattern is erased with the lapse of a predetermined time, such that the mark transfer can be repeated.

The exposure light source IL serves as a light source for projection exposure of the wafer W, placed on the wafer stage WS, to the pattern PT of the reticle RT through the projection lens LN. Also, as mark exposure shutters SHR and SHL are open, it serves as a light source for projection exposure of the photochromic plate PHC to the reticle marks RMR and RML through the mark observation mirrors AMR and AML and the projection lens LN.

Off-axis scope OS is a mark observing microscope having its focal plane placed substantially at the same Z position as the projection lens LN. By using this microscope OS, an image of a mark transferred to the wafer W or the photochromic plate, on the wafer stage WS, can be picked up. On the basis of the image output signal, the control unit CU then operates to calculate the amount of positional deviation of the image-picked-up mark from the center of the off-axis scope OS with respect to the X and Y directions. The off-axis scope OS has a variable magnification: for prealignment mark measurement (to be described later), a lower magnification is used to allow detection of a mark with a wider viewfield.

Figure 2:
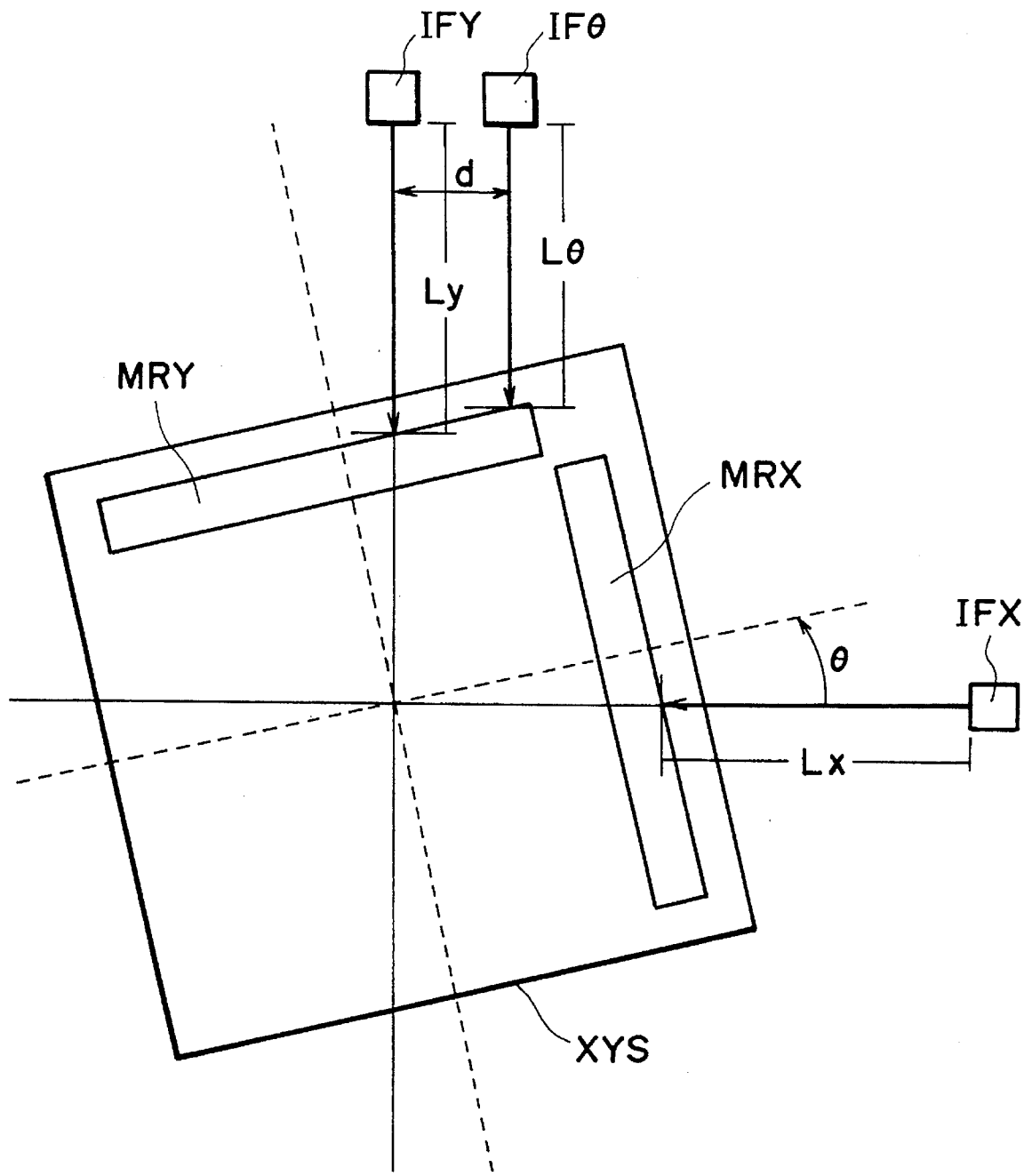
FIG. 2 is a schematic plan view of an X-Y-θ stage of this embodiment.
Figure 3A:
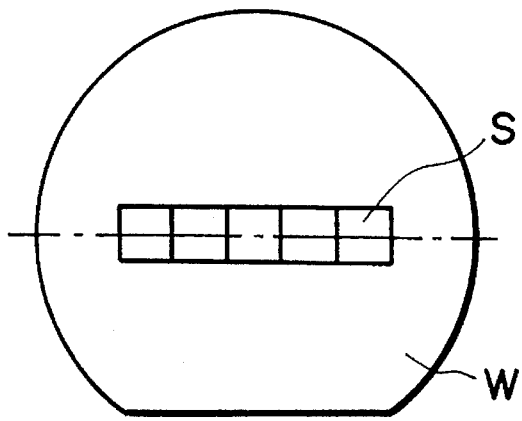
FIGS. 3A and 3B are schematic views for explaining chip rotation.
Figure 3B:
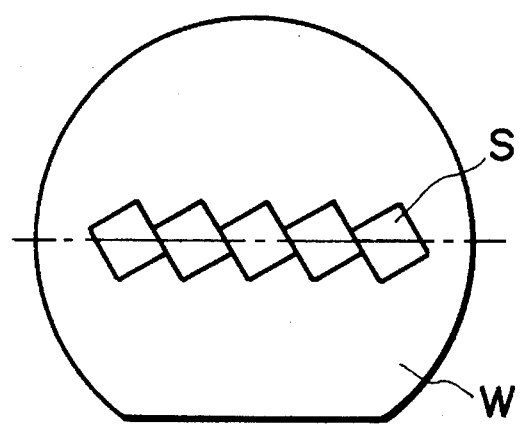
Figure 4A:
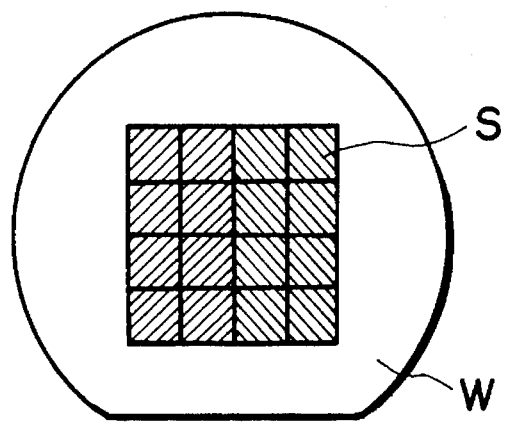
FIGS. 4A–4C are schematic views for chip rotation in a case where plural reticles are used.
Figure 4B:
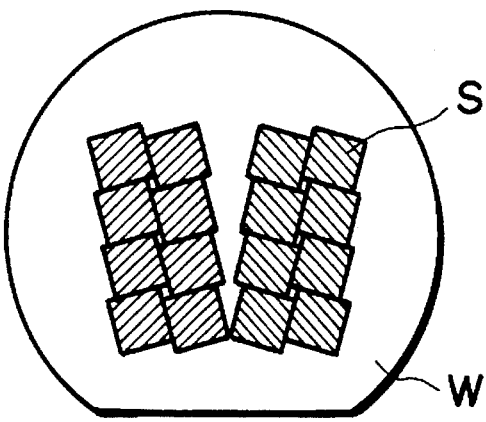
Figure 4C:
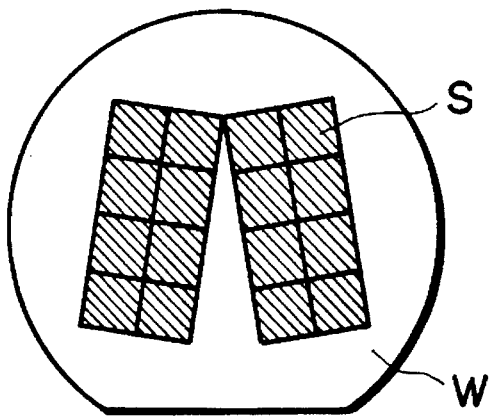

FIG. 2 is a schematic illustration of the X-Y-$\theta$ stage XYS, as the same is viewed from above (along the Z axis). The position of the X-Y-$\theta$ stage XYS with respect to the X and Y directions can be controlled on the basis of the lengths Lx and Ly as measured by the laser interferometers IFX and IFY. The position with respect to the $\theta$ direction can be calculated and controlled on the basis of the difference between the lengths Ly and L$\theta$ as measured by the laser interferometers IFY and IF$\theta$ as well as the distance d between the laser beams of the interferometers IFY and IF$\theta$, such as follows:

$$\theta = (Ly - L\theta)/d$$

Here, $\theta$ is corrected beforehand so that it becomes equal to zero as the X axis of the X-Y-$\theta$ stage XYS coincides with the X-axis direction of the apparatus as a whole which can be determined by a line connecting the reticle set marks RSMR and RSML. The correction may be made in accordance with the method disclosed in Japanese Patent Application, Application No. 351487/1992 (Laid-Open No. 181165/1994) filed in the name of the assignee of the subject application.

Figure 5:
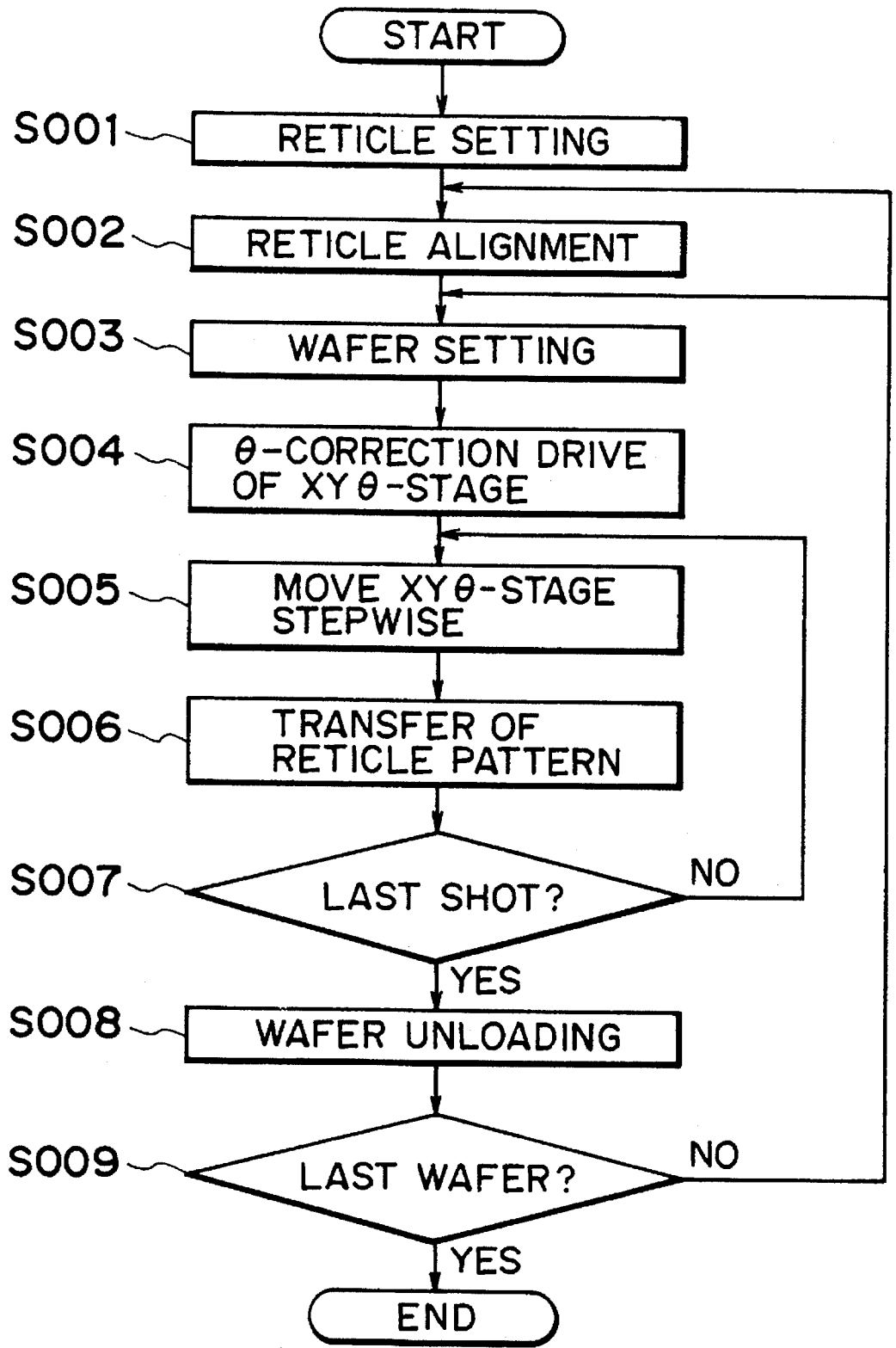
FIG. 5 is a flow chart of an example of a pattern transfer sequence in this embodiment.

FIG. 5 is a flow chart for explaining the sequence of forming a shot array with no chip rotation, upon a wafer W having no pattern formed thereon.

As the sequence starts, first at step S001 a reticle RT is loaded on the reticle stage RS, and it is held thereby through attraction. Then, at step S002, by using reticle set marks RSMR and RSML and reticle alignment marks RAMR and RAML, alignment of the reticle RT with respect to the projection lens LN is adjusted. More specifically, the paired marks RAMR and RSMR as well as the paired marks RAML and RSML are superposedly observed by the image pickup device CM through the mark observation mirrors AMR and AML, and the reticle stage RT is moved while being controlled by the control unit CU so that the positional deviation between the paired marks as detected by the image output signal is reduced into a predetermined tolerable range.

As the alignment operation is completed, from the final result of the positional deviation of the marks now within the tolerable range, a difference (deviation) between the X-axis direction of the reticle RT and the X-axis direction of the apparatus as a whole can be determined. It is memorized as a remaining difference θr. Also, from the same final result, the position of the center of the reticle RT can be determined. It is memorized as a vector R such as below (R is obtained by multiplying the actual position of the center of the reticle by the reduction magnification of the projection lens LN and by inverting the sign so that it represents the position of an inverted image):

$$R = \begin{bmatrix} Rx \\ Ry \end{bmatrix}$$

Subsequently, at step S003, a wafer is moved onto the wafer stage WS by means of a conveying hand, not shown. It is held by the wafer stage WS through attraction. Then, at step S004, the X-Y-θ stage XYS is rotated just by the remainder θr calculated at step S002. With this motion, the movement direction of the X-Y-θ stage XYS along the X or Y direction now exactly coincides with the X or Y direction of the projected image RTI of the reticle (see FIG. 10).

Subsequently, at steps S005–S007, the circuit pattern of the reticle RT is transferred by exposure onto the wafer W in a step-and-repeat manner. At step S005, from the information related to the design shot array as determined by the console CS beforehand, the coordinate position (Dix, Diy) of an i-th shot of the wafer W is determined and, then, the X-Y-θ stage XYS is moved to the position Ei which is represented by a vector such as:

$$Ei = R - Di = \begin{bmatrix} Rx - Dix \\ Ry - Diy \end{bmatrix}$$

where Di is a vector represented as follows:

$$Di = \begin{bmatrix} Dix \\ Diy \end{bmatrix}$$

Subsequently, at step S006, the exposure shutter SHT is opened/closed to execute exposure and transfer of the pattern of the reticle RT onto the wafer W through the projection lens LN. Then, at step S007, discrimination is made as to whether exposure of the last shot is completed or not. Steps S005–S007 are repeated until exposure completion is discriminated at step S007. Also, at step S008, the wafer W having its exposure and transfer process completed is off-loaded from the wafer stage WS by means of an unloading hand, not shown. At step S009, discrimination is made as to whether the exposure and transfer process of all the wafers W to be processed is completed or not. Steps S003–S009 are repeated until the completion is discriminated at step S009.

If at step S009 the result of discrimination is negative (there is a remaining wafer or wafers not processed), for each wafer or every few wafers the sequence may return to step S002 so that any change of the reticle position may be checked and corrected. In any way, with the processes described above, a shot array with no chip rotation can be defined on a wafer having no pattern formed thereon.

Referring to the flow chart of FIG. 6, description will be made of a case where a pattern is superposedly printed on a wafer W having a pattern already formed thereon. Steps S101–S103 are similar to steps S001–S003 of FIG. 5. With these operations, a reticle RT and a wafer W are set in the exposure apparatus, and the center position Rx of the reticle RT as well as the error θr of the reticle RT are memorized.

At step S104, a prealignment operation for the wafer W is executed with a relatively rough precision, by using marks of the patterns already formed on the wafer W. More specifically, as shown in FIG. 9, prealignment marks WAML and WAMR formed at two sites on the wafer W are displaced sequentially to the position under the off-axis scope OS. From the position of the mark detected on the basis of the image picked up and from the coordinate position of the X-Y-θ stage XYS assumed at that time, the position of each mark can be determined and then the amount of deviation of the wafer as a whole can be determined. The wafer deviation is memorized in the manner that any elongation or quantity of rotation of the wafer is expressed by a matrix A while the amount of wafer shift is expressed by a vector S:

$$A = \begin{bmatrix} 1 + \beta x & -\theta y \\ \theta x & 1 + \beta y \end{bmatrix} \quad S = \begin{bmatrix} Sx \\ Sy \end{bmatrix}$$

wherein βx and βy represent elongation ratios of the wafer in the X and Y directions, θx and θy denote the amounts of rotational deviation of the wafer with respect to the X and Y directions, and Sx and Sy denote the amounts of shift deviation in the X and Y directions which are to be referred to at a later stage. Here, since the value of θ is sufficiently small, sin (θ)≅θ and cos (θ)≅1 are assumed. Similar approximation is made in equations to be mentioned later.

Since the measurement at this step is based on measurement of two marks of the wafer, rotational deviation of the wafer cannot be detected independently with respect to each of X and Y. Thus, the rotational error θ of the wafer as a whole is taken and memorized as:

θx=θy=θ

For this measurement, the magnification of the off-axis scope OS is changed to the lower one, such that a mark can be detected with a wider viewfield.

Figure 9A:
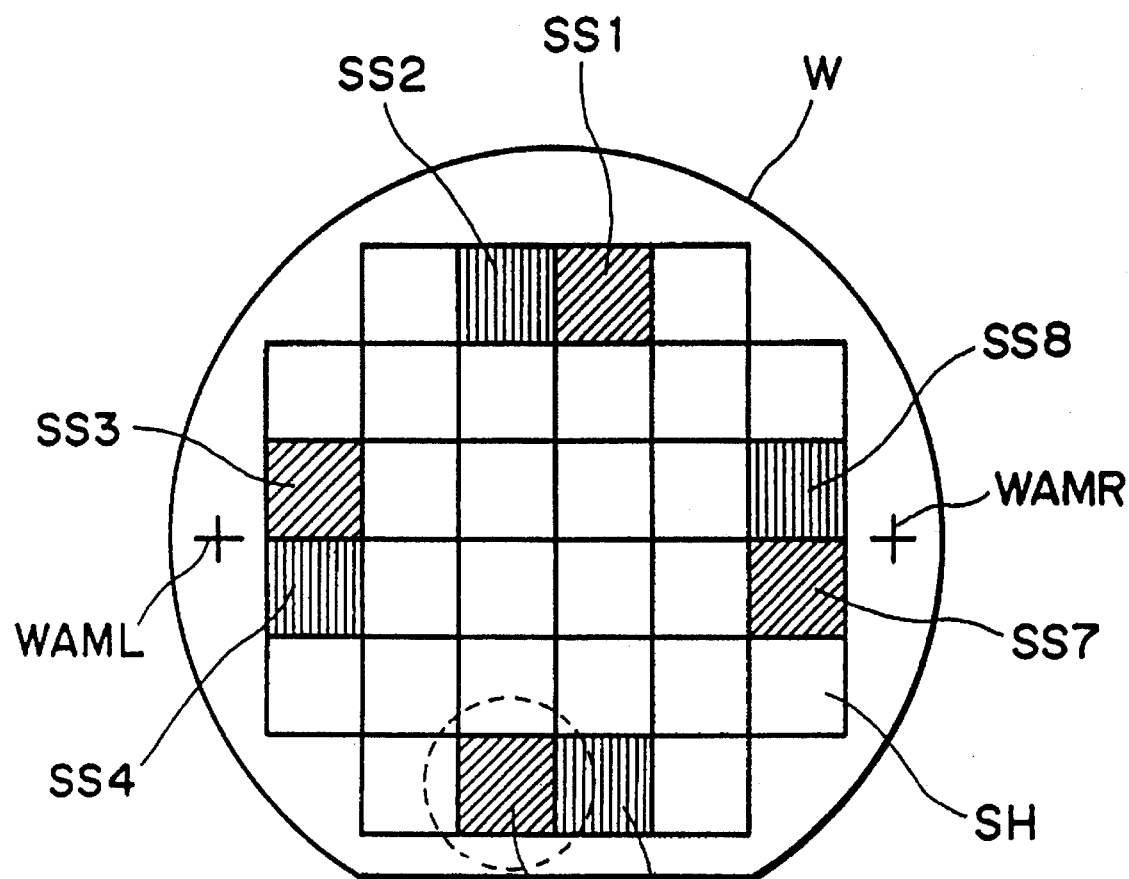
FIG. 9A is a schematic view for explaining alignment marks of a wafer and sample shots thereof.
Figure 9B:
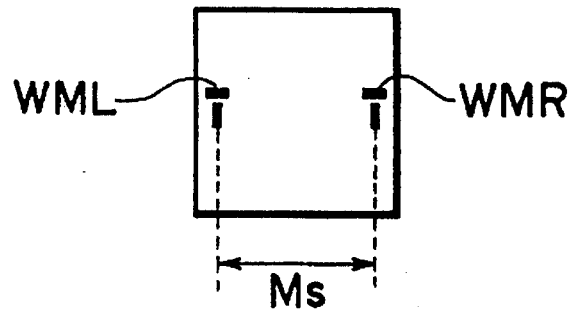
FIG. 9B is an enlarged view of FIG. 9A.

Subsequently, at step S105, the shot array and the chip rotation on the wafer W are measured. As shown in FIGS. 9A and 9B, each shot pattern formed on the wafer has alignment marks WML and WMR at its left and right sides. Of these marks, those of the shots having been designated as sample shots beforehand are moved sequentially to the position under the off-axis scope OS. From the position of the mark detected on the basis of the image picked up and from the position coordinates of the X-Y-θ stage XYS assumed at the corresponding time, the position of each mark can be determined and then the amount of deviation of the wafer as a whole is determined. For this measurement, the magnification of the off-axis microscope OS is changed to the higher one, such that more precise measurement is assured.

Here, the sample shots selected beforehand may be those depicted as SS1, SS3, SS5 and SS7 in FIG. 9, for example.

If the design position of the mark of such a sample shot is represented by a vector such as:

$$M = \begin{bmatrix} Mx \\ My \end{bmatrix}$$

and the position of the off-axis scope OS is represented by a vector such as:

$$C = \begin{bmatrix} Cx \\ Cy \end{bmatrix}$$

then the target position (destination) to which the X-Y-θ stage XYS should be moved for measurement of that mark, can be represented by the following vector:

$$P = \begin{bmatrix} Px \\ Py \end{bmatrix} = C - (AM + S)$$

$$= \begin{bmatrix} Cx - Mx - Mx \cdot \beta x + My \cdot \theta y - Sx \\ Cy - My - My \cdot \beta y - Mx \cdot \theta x - Sy \end{bmatrix}$$

When the stage is moved to this vector position P, the alignment mark can be viewed substantially at the center of the off-axis scope OS, and the position of each mark is obtained from the position of the mark detected on the basis of the image picked up and from the position coordinates of the X-Y-θ stage XYS assumed at that time. Then, by using these values, the amounts of deviations βx, βy, θx, θy, Sx and Sy of the wafer as a whole are calculated again. This means that the matrix A and the vector S detected at step S104 are determined with higher precision by using the off-axis of higher magnification and on the basis of measurement of plural marks.

Also, from the difference between measured values of the left and right alignment marks of the i-th sample shot and from the distance between these marks, the amount of chip rotation of the i-th shot is determined as follows:

θci=(Ymr−Yml)/Drl where Ymr is the Y measured value of the right-hand mark, Yml is the Y measured value of the left-hand mark, and Drl is the distance between the left-hand and right-hand marks. Also, as an average of all the sample shots, an average chip rotation such as below is memorized:

θc=Σθi/(number of the sample shots)

Subsequently, at step S106, the X-Y-θ stage XYS is rotated in the θ direction by θw=θr−θx by which the orientation of the shot array is registered with the orientation of the reticle RT.

Figure 11A:
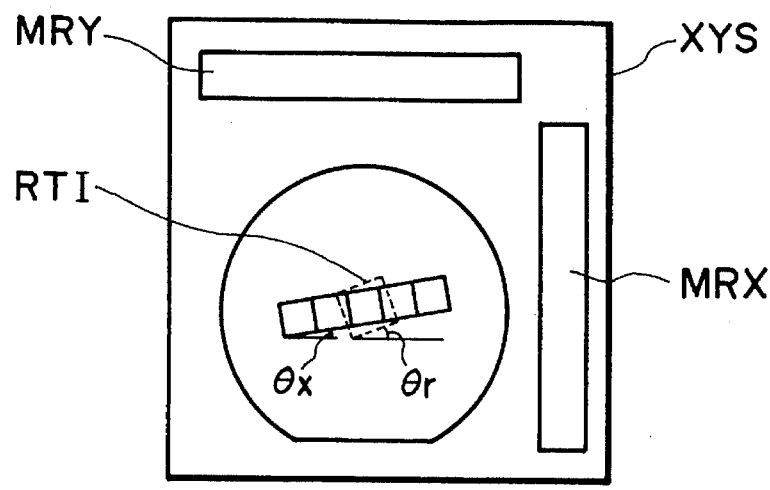
FIG. 11A–11C are schematic views for explaining the principle of chip rotation correction in another example.
Figure 11B:
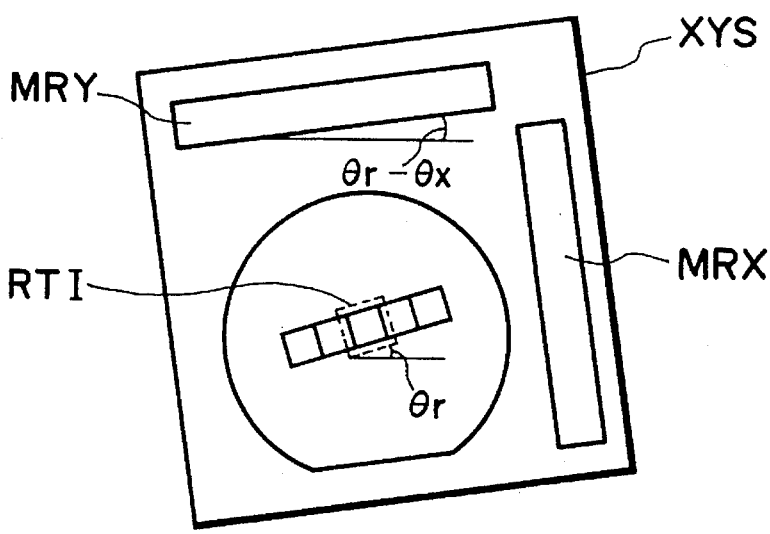

On this occasion, the wafer having been placed such as illustrated in FIG. 11A is rotated thereby, such as shown in FIG. 11B. Thus, provided that the patterns already formed on the wafer W have no chip rotation, the projected reticle image RTI and the shot orientation are exactly registered with each other.

Figure 11C:
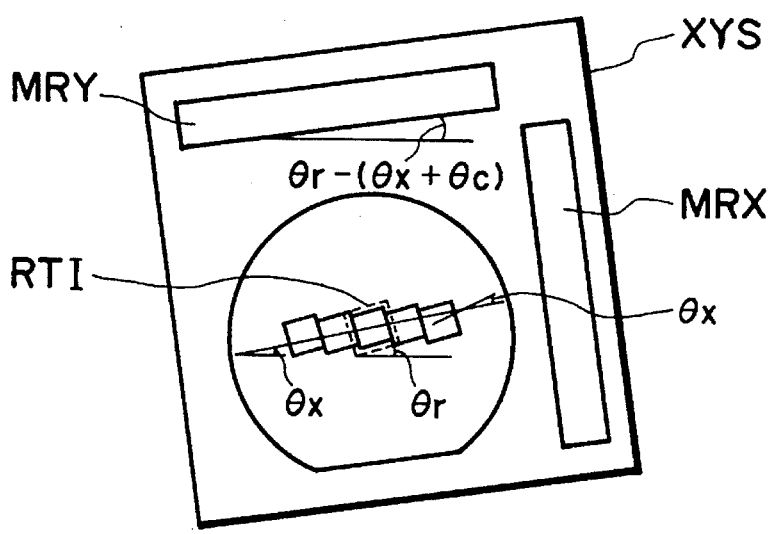

Alternatively, the X-Y-θ stage XYS may be rotated by

θw=θr−(θx+θc)

such that the average orientation of the shots are aligned with the orientation of the reticle. On that occasion, the wafer W is rotated thereby such as shown in FIG. 11C. Thus, even if the patterns already formed on the wafer have chip rotation, the projected reticle image RTI and the shot orientation are exactly registered with each other.

Subsequently, at step S107, the shot array measurement and the chip rotation measurement having been made at step S105 are executed again with higher precision by using an increased number of marks to be measured. More specifically, a larger number of sample shots are selected, such as at SS1, SS2, SS3, SS4, SS5, SS6, SS7 and SS8 in FIG. 9, and alignment marks of them are measured in a similar way as step S105.

In this step, however, the X-Y-θ stage XYS is rotated, as compared with the case of step S105. Thus, the target position to which the X-Y-θ stage XYS should be moved to assure that the alignment mark is viewed at the center of the off-axis scope OS, is expressed by the following vector:

$$P = \begin{bmatrix} Px \\ Py \end{bmatrix} = \begin{bmatrix} 1 & \theta w \\ -\theta w & 1 \end{bmatrix} C - (AM + S)$$

$$= \begin{bmatrix} Cx + \theta w \cdot Cy - Mx - Mx \cdot \beta x + My \cdot \theta y - Sx \\ Cy - \theta w \cdot Cx - My - My \cdot \beta y - Mx \cdot \theta x - Sy \end{bmatrix}$$

When the stage is moved to this vector position, the alignment mark can be viewed substantially at the center of the off-axis scope OS. Thus, from the position of the mark detected on the basis of the image picked up and from the position coordinates of the X-Y-θ stage XYS assumed at that time, the position of each mark can be determined.

Then, from the obtained values, the amounts of deviations βx, βy, θx, θy, Sx and Sy of the wafer as a whole are calculated freshly. This corresponds to the matrix A and the vector S having been detected at step S105 being determined with higher precision on the basis of a measurement of a large number of marks. Also, since at step S106 the X-Y-θ stage XYS has been rotated by almost all the necessary amount, even if the rotation produces an Abbe error, it can be measured through the measurement at this step. Further, average chip rotation θc is detected in a similar way as step S105.

Then at step S108, the X-Y-θ stage XYS is rotated by

θw=θr−θx in a similar way as step S106, so as to assure registration of the orientation of the shot array with the orientation of the reticle RT. Alternatively, the X-Y-θ stage XYS may be rotated by θw=θr−(θx+θc)

so that the average orientation of the shots is aligned with the reticle orientation.

Subsequently, at steps S109–S111, the circuit pattern of the reticle RT is lithographically transferred to the wafer W in a step-and-repeat manner. More specifically, at step S109, from the information related to the shot layout having been designated by the console CS, the position coordinates Dix and Diy of the i-th shot are determined. Also, from the matrix A and the vector S determined at step S107, the movement target vector Ei of the X-Y-θ stage XYS is determined as follows:

$$Ei = R - (AD + S)$$

$$= \begin{bmatrix} Rx - Dix - Dix \cdot \beta x + Diy \cdot \theta y - Sx \\ Ry - Diy - Diy \cdot \beta y - Dix \cdot \theta x - Sy \end{bmatrix}$$

Then, the X-Y-θ stage is moved to that position. Namely, the X-Y-θ stage XYS is moved in step-and-repeat manner so that its position in the X and Y directions becomes coincident with the position determined by correcting, by calculation, the design shot array of the wafer on the basis of the rotational error of the shot array of the wafer W in the θ direction (about the Z axis).

At step S110, the exposure shutter SHT is opened and closed whereby the pattern of the reticle RT is projected and printed on the wafer W through the projection lens LN. Then, at step S111, a discrimination is made as to whether exposure of the last shot of the wafer is completed or not. Steps S009–S111 are repeated until the completion is discriminated. Also, at step S112, the wafer having its exposure process completed is off-loaded from the wafer stage Ws, by using an unloading hand mechanism, not shown. At step S113, a discrimination is made as to whether an exposure process of all the wafers to be processed is completed or not. Steps S103–S113 are repeated until process completion is discriminated.

If the result of the discrimination at step S113 is negative (there remains a wafer or wafers not processed), for each wafer or every few wafers the sequence may return to step S102 and any change in position of the reticle RT may be checked and corrected. In any event, with the processes described above, patterns with no chip rotation can be superposedly printed on a wafer having patterns already formed thereon.

Figure 7:
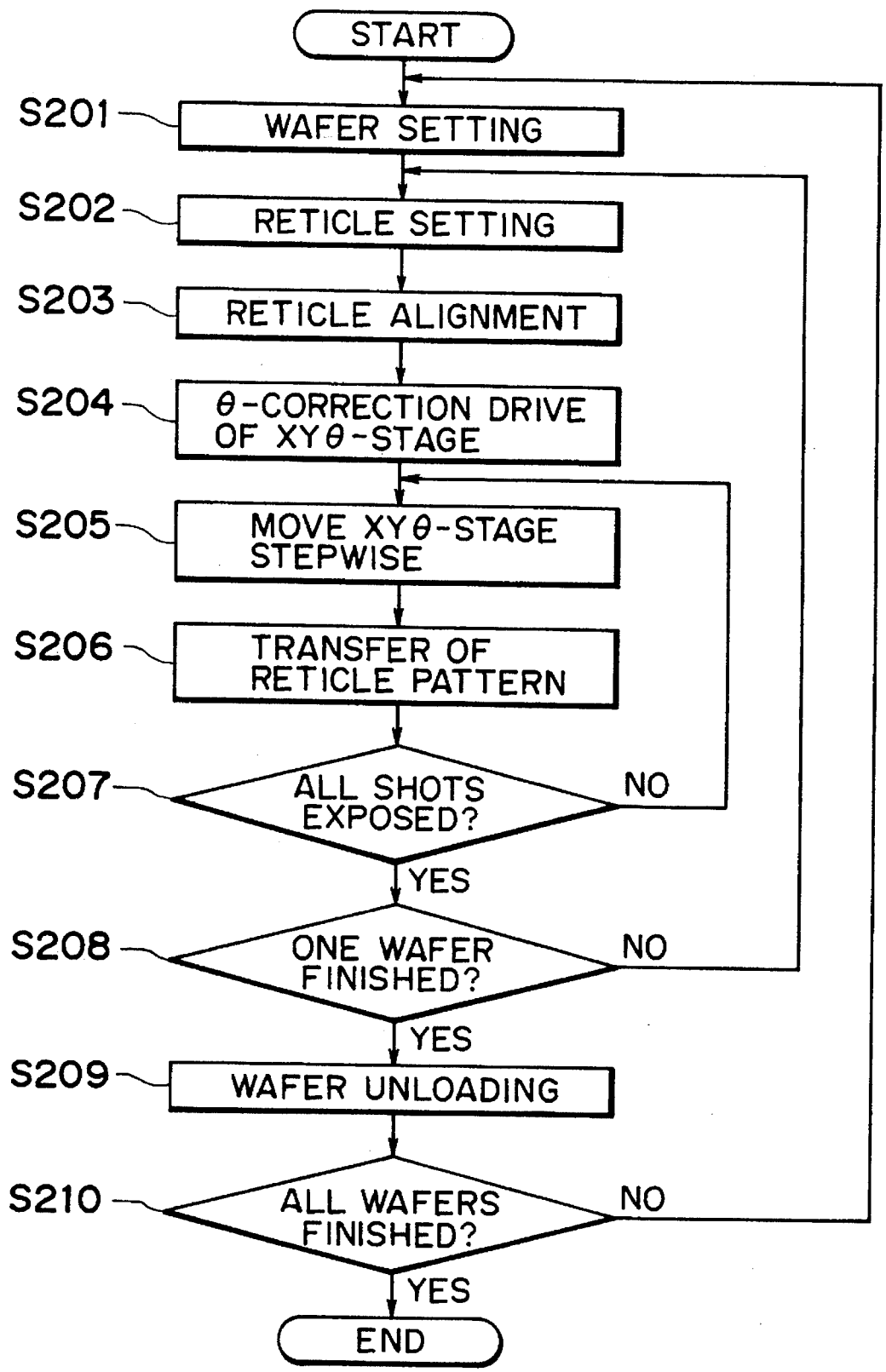
FIG. 7 is a flow chart of a further example of a pattern transfer sequence in this embodiment.

Referring to the flow chart of FIG. 7, description will be made of the sequence for forming a shot array with no chip rotation upon a wafer, having no pattern formed thereon, by using a plurality of reticles.

First, at step S201, like step S003 of FIG. 5, a wafer W is loaded on the wafer stage WS, whereby it is held thereon through attraction. Then, at step S202, like step S001 of FIG. 5, a reticle RT is loaded on the reticle stage RS, whereby it is held thereon through attraction. At step S203, like step S002 of FIG. 5, reticle alignment and positional error measurement are executed, and, from the final results, the center position vector R and axis azimuth θr of the reticle are memorized.

Figure 10:
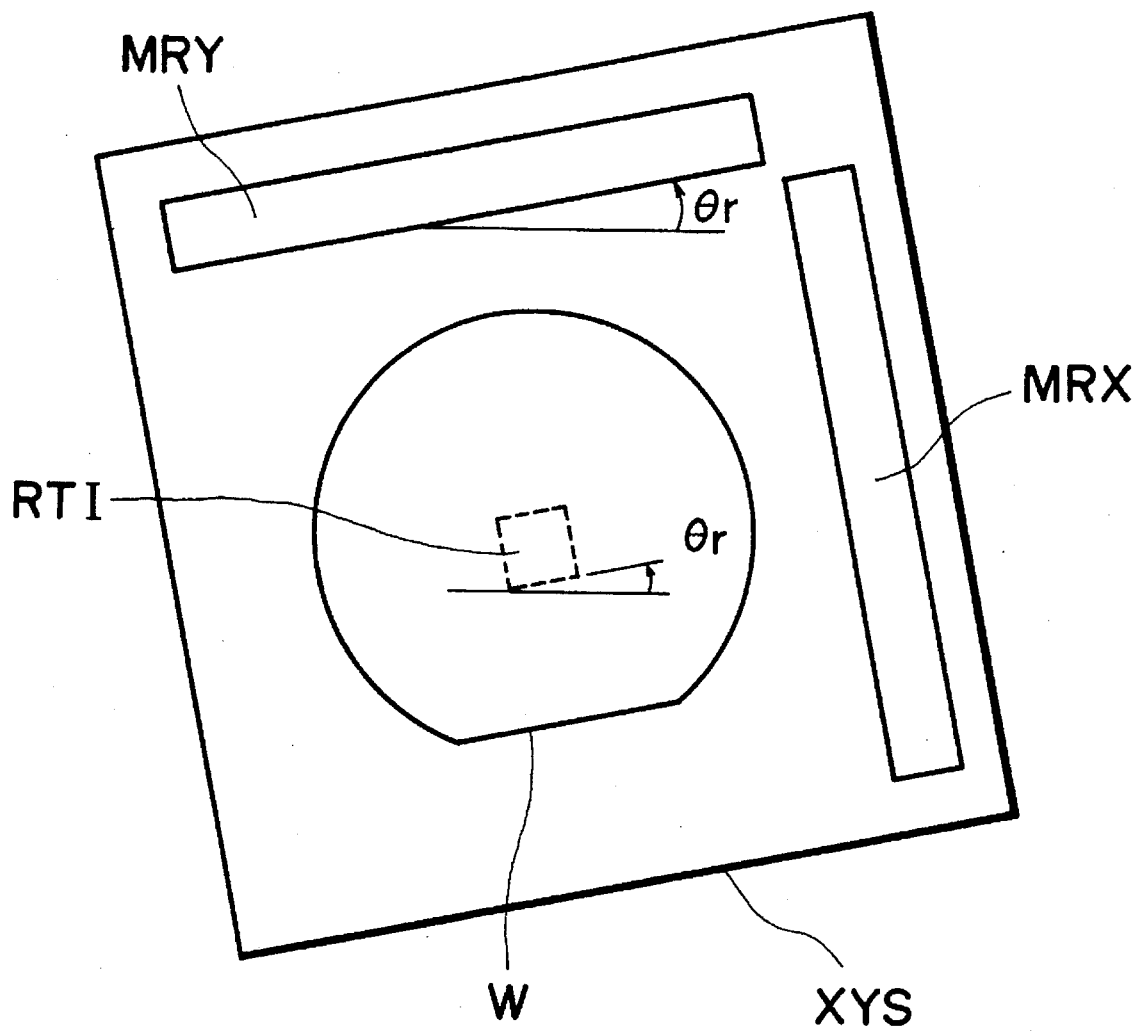
FIG. 10 is a schematic view for explaining the principle of chip rotation correction.

Then, at step S204, the X-Y-θ stage XYS is rotated by an amount θr measured at step S203. With this motion, the movement axis in the X or Y direction of the X-Y-θ stage XYS is exactly aligned with the X or Y direction axis of the projected image RTI of the reticle RT, as shown in FIG. 10.

Subsequently, at steps S205–S207, the pattern of the reticle RT set at step S203 is transferred to the wafer W in step-and-repeat exposures. More specifically, at step S205, from the information related to the design shot array determined by the console CS beforehand, the position coordinates Dix and Diy of the i-th shot, upon the wafer W, are determined. Also, the X-Y-θ stage XYS is moved to the position Ei as represented by the following vector:

$$Ei = R - Di = \begin{bmatrix} Rx - Dix \\ Ry - Diy \end{bmatrix}$$

Then, at step S206, the exposure shutter SHT is opened and closed, whereby the pattern of the reticle RT is transferred to the wafer WF through the projection lens LN. Then, at step S207, a discrimination is made as to whether exposure of the zones to which the pattern of the reticle, having been set at step S203, is completed or not. Steps S205–S207 are repeated until the exposure of these zones is completed.

Subsequently, at step S208, a discrimination is made as to whether exposure of all the shot zones of this wafer is completed or not. If the wafer has zones to which a pattern of a different reticle is to be transferred, the sequence goes back to step S202 to execute the reticle setting again. Then, steps S202–S208 are repeated.

If completion of exposure of all the pattern transfer zones of this wafer is discriminated, then at step S209 the wafer W having its exposure process completed is off-loaded from the wafer stage WS by means of an unloading hand mechanism, not shown. At step S210, a discrimination is made as to whether exposure of all the wafers to be processed is completed or not. Steps S201–S210 are repeated until the completion is discriminated. With the processes described above, a shot array with no chip rotation can be formed on a wafer, having no pattern formed thereon, even if different reticles are used.

Referring to the flow chart of FIG. 8, description will be made of the sequence for superposedly transferring patterns on a wafer, having patterns already formed thereon, by using a plurality of reticles. First, at step S301, like step S003 of FIG. 5, a wafer is loaded on the wafer stage WS and it is held thereby through attraction. At step S302, like step S001 of FIG. 5, a reticle RT is loaded on the reticle stage RS and it is held thereby through attraction. At step S303, like step S002 of FIG. 5, reticle alignment and positional error measurement are executed and, from the final result, the center position vector R and axis azimuth θr of the reticle are memorized.

Subsequently, at step S304, a discrimination is made as to whether the alignment with this wafer has been completed or not. If the result is affirmative, the sequence skips to step S309. If the result is negative, the sequence goes to step S305. At steps S305–308, like steps S104–S107 of FIG. 6, wafer alignment measurement is done in a similar manner. At step S309, like step S108 of FIG. 6, the X-Y-θ stage XYS is rotated so as to provide registration of the orientation of the shot array with the orientation of the reticle RT, such as illustrated in FIG. 11B. Alternatively, the average orientation of the shots may be aligned with the orientation of the reticle RT, as illustrated in FIG. 11C.

Figure 6:
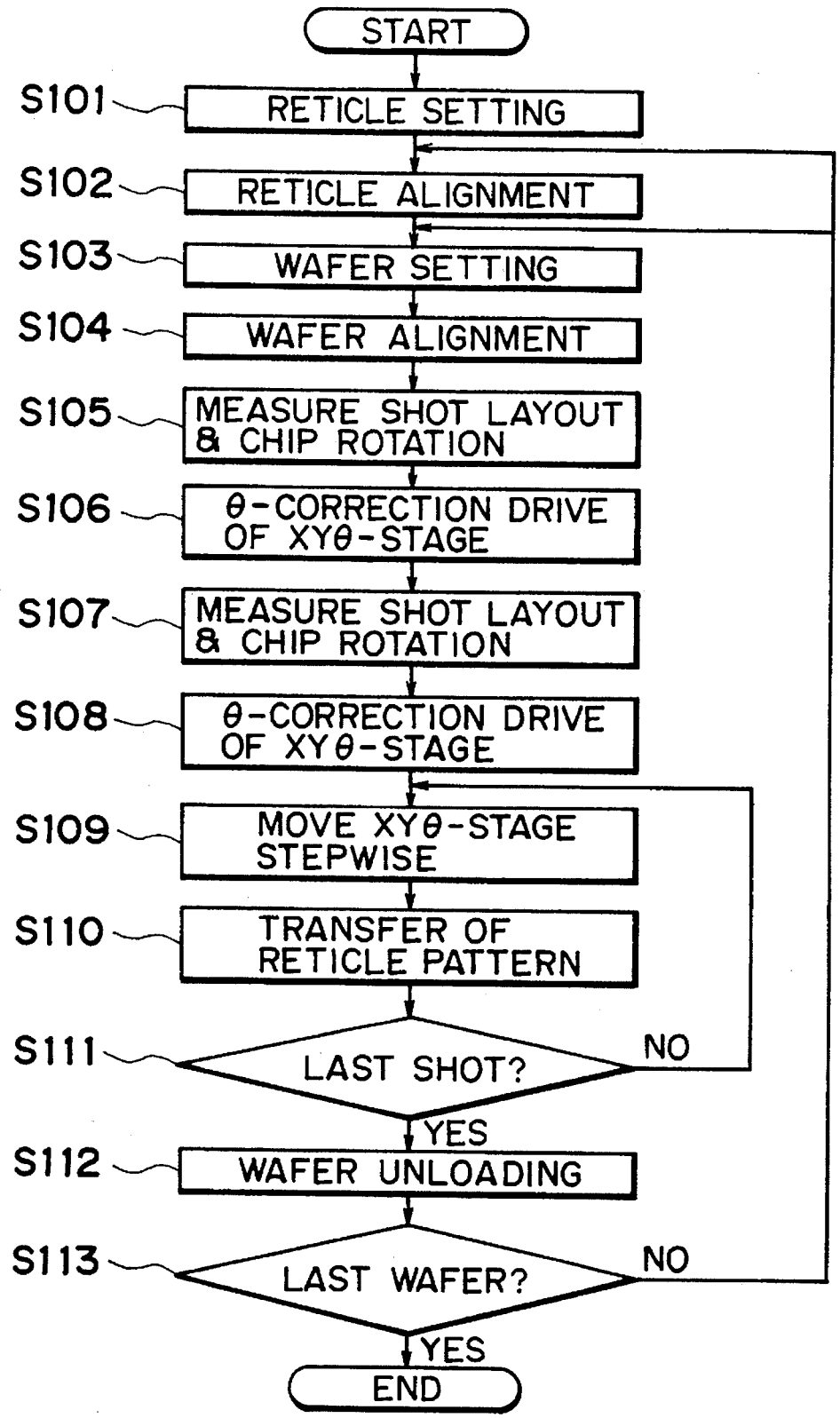
FIG. 6 is a flow chart of another example of a pattern transfer sequence in this embodiment.

Then, at steps S310–S312, like steps S109–S111 of FIG. 6, the pattern of the reticle, having been set at step S303, is transferred onto the wafer W by step-and-repeat exposures. At step S313, a discrimination is made as to whether pattern transfer to all the shot zones of the wafer is completed or not. If there remains a zone or zones to which a pattern of a different reticle is to be transferred, the sequence goes back to step S302 to execute the reticle setting freshly. Then, steps S302–S313 are repeated.

If completion of exposures of all the pattern transfer zones of the wafer is discriminated, then at step S314 the wafer having its exposure process completed is off-loaded from the wafer stage WS by means of an unloading hand mechanism, not shown. At step S315, a discrimination is made as to whether exposure of all the wafers is completed or not. Steps S301–S315 are repeated until the completion is discriminated. With the processes described above, by using plural reticles, patterns can be superposedly printed on a wafer without chip rotation, which wafer has patterns already formed thereon.

Figure 8:
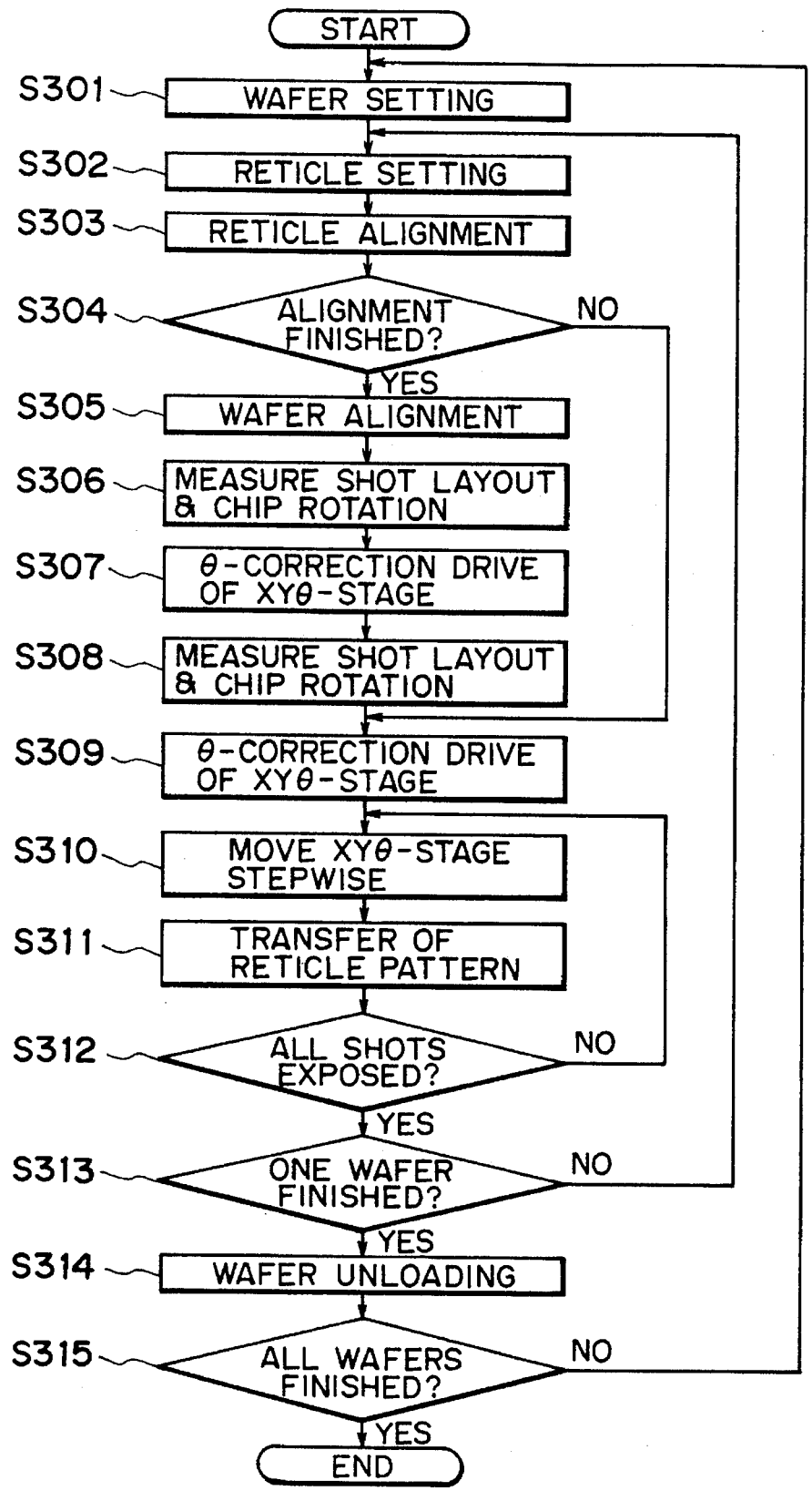
FIG. 8 is a flow chart of a still further example of a pattern transfer sequence in this embodiment.

In the embodiment of FIG. 8, if the result of the discrimination at step S304 is affirmative (alignment operation with that wafer is completed), the sequence skips to step S309. However, the alignment operation (steps S305–S309) may be done with respect to every region of the reticle used.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing method for transferring a pattern of an original on different zones of a substrate, said method comprising the steps of:

holding the original with an original stage;

holding the substrate with a substrate stage, the substrate stage being movable in a direction of an X-axis and in a direction of a Y-axis and also being movable rotationally in a rotational direction about a Z-axis;

measuring the position of the substrate stage with respect to each of the X-axis direction, the Y-axis direction and the rotational direction about the Z-axis by use of a laser interferometer, the substrate stage having a reflective member for reflecting a laser beam from the laser interferometer for measurement of the position of the substrate stage, the reflective member being movable as a unit with the substrate in each of the X-axis and the Y-axis directions and also being movable rotationally as a unit with the substrate in the rotational direction about the Z-axis;

detecting rotation, about the Z-axis, of the X-axis or Y-axis of the original held by the original stage;

rotationally moving the substrate stage about the Z-axis on the basis of the detection so that the rotation of the X-axis or Y-axis of the substrate stage about the Z-axis becomes substantially equal to the rotation of the X-axis or Y-axis of the original about the Z-axis, wherein, with the rotational movement of the substrate stage, the substrate and the reflective member are rotationally moved as a unit with each other and the position of the substrate stage with respect to the rotational direction about the Z-axis is measured by use of the laser interferometer and the reflective member; and sequentially transferring the pattern of the original onto the zones of the substrate, wherein the movement of the substrate is controlled in accordance with a measurement output of the laser interferometer.

2. A method according to claim 1, wherein, in said transferring step, the substrate stage is moved in a step-and-repeat manner so that the position of the substrate stage with respect to the X-axis and Y-axis directions substantially corresponds to a position determined from a design shot array.

3. A method according to claim 2, wherein, when a pattern of a first original is to be transferred to a first zone of the substrate and a pattern of a second original is to be transferred to a second zone of the substrate, said detecting step and said rotationally moving step are executed each time said original holding step is executed.

4. A method according to claim 1, wherein, in said detecting step, a rotational error of a shot array on the substrate about the Z-axis is detected, and wherein, in said rotationally moving step, the substrate stage is rotationally moved about the Z-axis so that the direction of rotation of the X-axis or Y-axis of the shot array about the Z-axis substantially corresponds to a direction of rotation of the X-axis and Y-axis of the original about the Z-axis.

5. A method according to claim 4, wherein, in said transferring step, the substrate stage is moved in a step-and-repeat manner so that the position of the substrate stage with respect to the-X-axis and Y-axis directions substantially corresponds to a position determined by correcting a design shot array on the basis of the rotational error of the shot array, upon the substrate, about the Z-axis.

6. A method according to claim 5, wherein, when a pattern of a first original is to be transferred to a first zone of the substrate and a pattern of a second original is to be transferred to a second zone of the substrate, said detecting step and said rotationally moving step are executed each time said original holding step is executed.

7. A method according to claim 1, wherein, in said detecting step, an average rotational error of the shots upon the substrate about the Z-axis is detected, and wherein, in said rotationally moving step, the substrate stage is rotationally moved about the Z-axis so that an average direction of rotation of the X-axis or Y-axis of the shots about the Z-axis substantially corresponds to the direction of rotation of the X-axis or Y-axis of the original about the Z-axis.

8. A method according to claim 7, wherein, in said detecting step, a rotational error of the shot array on the substrate about the Z-axis is detected, and wherein, in said transferring step, the substrate stage is moved in a step-and-repeat manner so that the position thereof with respect to the X-axis and Y-axis directions substantially corresponds to a position determined by correcting a design shot array on the basis of the rotational error of the shot array, upon the substrate, about the Z-axis.

9. A method according to claim 8, wherein, when a pattern of a first original is to be transferred to a first zone of the substrate and a pattern of a second original is to be transferred to a second zone of the substrate, said detecting step and said rotationally moving step are executed each time said original holding step is executed.

* * * * *

UNITED STATES PATENT AND TRADEMARK OFFICE
CERTIFICATE OF CORRECTION

PATENT NO. : 5,563,708
DATED : October 8, 1996
INVENTOR(S) : AKIYA NAKAI

It is certified that error appears in the above-indentified patent and that said Letters Patent is hereby corrected as shown below:

ON THE COVER PAGE

IN THE TITLE, ITEM [54]

"INTERFERICALLY" should read --INTERFEROMETRICALLY--.

COLUMN 1

Line 3, "INTERFERICALLY" should read --INTERFEROMETRICALLY--.

COLUMN 3

Line 10, "FIG. 11A-11C" should read --FIGS. 11A-11C--.

COLUMN 9

Line 19, "Ws," should read --WS,--.

Signed and Sealed this

Twenty-fifth Day of March, 1997

Attest:

BRUCE LEHMAN

Attesting Officer

Commissioner of Patents and Trademarks